United States Patent [19]

Hed

[11] Patent Number: 5,171,732
[45] Date of Patent: Dec. 15, 1992

[54] METHOD OF MAKING A JOSEPHSON JUNCTION

[75] Inventor: Aharon Z. Hed, Nashua

[73] Assignee: Troy Investments, Inc., Nashua, N.H.

[21] Appl. No.: 863,390

[22] Filed: Apr. 3, 1992

Related U.S. Application Data

[60] Continuation of Ser. No. 655,323, Feb. 13, 1991, abandoned, which is a division of Ser. No. 290,178, Dec. 23, 1988, Pat. No. 5,064,809.

[51] Int. Cl.$^5$ .................... H01B 12/00; H01L 39/22
[52] U.S. Cl. .......................................... 505/1; 257/31
[58] Field of Search ................... 357/4, 5; 505/1

[56] References Cited

U.S. PATENT DOCUMENTS 3,906,538  9/1975  Mortisoo et al. .................. 357/4
4,960,751  10/1990  Yamazaki ........................... 505/1

FOREIGN PATENT DOCUMENTS 58-141572  8/1983  Japan .
1-14977  1/1989  Japan .
2-62081  3/1990  Japan .................................. 357/5

Primary Examiner—Jerome Jackson, Jr.
Assistant Examiner—Daniel N. Russell
Attorney, Agent, or Firm—Herbert Dubno

[57] ABSTRACT

A Josephson junction consisting of high temperature ceramic superconductors layers, separated by an ultra-thin insulating barrier made of an non oxide substance like diamond-like carbon, is described. An integral part of this disclosure is the technique involving the use of an activated oxygen species for providing an oxygen chemical potential which is higher than that obtainable at barometric pressure. Also clarified are the structure and method of manufacturing the said junction, using high temperature superconductors.

5 Claims, 2 Drawing Sheets

METHOD OF MAKING A JOSEPHSON JUNCTION

This is a continuation of co-pending application Ser. No. 07/655,323 filed on Feb. 13, 1991 now abandoned which is a division of Ser. No. 07/290,178 filed Dec. 23, 1988 U.S. Pat. No. 5,064,809.

CROSS REFERENCE TO RELATED APPLICATION

This application is related to my commonly assigned concurrently filed copending application Ser. No. 07/288,403 filed Dec. 21, 1988 (now U.S. Pat. No. 4,975,265 of Dec. 4, 1990) which discloses a method of and an apparatus for producing the delta singlet oxygen which is here used to reduce the thickness of the deposited diamond-like carbon layers, and also may be used during the deposition of the superconductor layers.

FIELD OF THE INVENTION

This invention relates to bidirectional diodes, known as Josephson junctions, capable of operating at temperatures in excess of 77K, the boiling temperature of liquid nitrogen.

BACKGROUND OF THE INVENTION

The classical Josephson junction is an electronic device in which two superconducting elements are separated by a thin insulating film. The two superconducting elements can be of the same composition, or may differ from each other. The unique current vs voltage characteristics of the Josephson junction depend on the binding energy of paired charge carriers in the superconducting elements. When both elements are the same, the Josephson junction acts as a bidirectional diode, switching from an essentially non-conducting state (with very little leakage current) to a conducting state. The switching occurs at a voltage corresponding to the binding energy of the charge-carrier pairs. When the two superconductors are unequal, or their charge carriers possess different binding energies, a more complex characteristic results in which a region of negative resistance exists.

Until recently, it was believed that superconductivity above 23K was not possible. This belief was noted in the theoretical work now named the BCS theory (Bardeen, Cooper and Schrieffer) which predicted such an upper limit.

The temperature at which superconductivity occurs in a superconductor (in the absence of any external magnetic fields) is termed the critical temperature of that superconductor and this term will be used herein.

In the early 1970's a number of theoretical proposals were presented, suggesting that the critical temperature for superconductivity could be increased. (V. L. Ginzburg, Usp. Fiz. Nauk. 101, 185 (1970)) (D. Allender, J. Bray, J. Bardeen, Phys. Rev. B8, 4433 (1973)), but the lack of any discoveries of superconductivity above 23K, solidified the belief that indeed this critical temperature could not be exceeded. A significant experimental breakthrough in high temperature superconductivity (critical temperatures in excess of 23K) was provided in November 1986 by Bednorz and Muller when they published a tentative disclosure of high temperature superconductivity (Georg Bednorz and Alex Muller, Z. Phys. B64, 189 (1986)), followed rapidly by confirmation by others.

Confirmation of a critical temperature of 93K was reported by Chu for yttrium-barium-copper oxide ceramic (M. K. WU, J. R. Ashburn, C. J. Tang, P. H. Hor, R. L. Meng, L. Gao, Z. J. Huang, Y. Q. Wang, and C. W. Chu, Phys. Rev. Lett. 58, Mar. 2, 1987, p. 908.) This material was dubbed the 123 compound and served as a model for advanced research in the field.

During 1987 and 1988, a number of families of high temperature superconductors were discovered with confirmed critical temperatures all the way to 162K. These materials are usually ceramics containing copper (including elements in the trivalent state), an alkaline metal (Ca, Sr. or Ba) and a rare earth including Yttrium.

In classical low-temperature Josephson junctions, the insulating layer is traditionally obtained by an oxidation step on the metallic superconducting surface, thus creating an insulating oxide. In many instances, deposition of an insulating oxide is practiced as well. The thickness of the insulating layer is well controlled and is, in some cases, in the neighborhood of 100 to 1000 angstroms in thickness.

In the high temperature superconductors (herein high temperature superconductor means a superconductor with a critical temperature above the BCS limit of 23K) which have now been synthesized, however, the coherence length of the charge carriers pairs is of the order of 20 to a maximum of 100 angstroms. Thus for a Josephson junction to operate in the mode whereby paired charge carriers tunnel through the junction with the associated tunneling effects, insulating layers that have thicknesses of the same order of magnitude as the coherence length are mandatory. Furthermore, the high temperature superconducting substances discovered so far are all oxides themselves, unlike the metallic classical superconductors.

There have been a number of natural major road blocks to achieving a very thin insulating barrier with traditional oxides. Specifically, there are problems of interdiffusion and difficulties in obtaining thin layers of insulators by current deposition practices. Most of the high temperature superconductors are mixed oxides, and are relatively unstable from a thermodynamic point of view. Furthermore, in any deposition process which one may employ to form said insulating layer, the diffusion coefficient of the various cations in the superconducting oxide and the insulating oxide varies between the cations. As a result of these differences, disproportionation (from the original composition) of the cations in the superconductor near the insulating layer often occurs. This is associated with a loss of superconductivity near such insulating layer, thus defeating the purpose of the junction.

Non-superconductive phases arise when the original oxide superconducting phase comes into contact with other oxides at high temperatures (above 700° C. for most superconducting compounds, but even lower for others). These non-superconducting layer will form with depths that are greater than the required depth of the insulating layer in the high temperature Josephson junction, thus defeating the intended purpose of the device.

OBJECTS OF THE INVENTION

Thus, it is an object of the present invention to provide Josephson junctions employing oxide high temperature superconductors with non-oxide insulating barriers.

Still another object is to provide improved Josephson junctions that can operate at liquid nitrogen temperatures.

Yet another object is to provide a method of so forming Josephson junctions that the superconducting surface will contain excess oxygen, but that the final composition obtained through subsequent processing is that needed to maintain the superconducting state.

Yet another object of the instant invention is to provide specific structures of such Josephson junctions.

A final object of the instant invention is to provide methods employing classical plasma deposition techniques in the presence of delta singlet oxygen (this species has been employed in the prior art in oxygen/iodine chemical lasers) to preserve the high oxidation state of copper in high temperature superconductors during the subsequent deposition of the insulating layer which is carried under somewhat reducing conditions.

SUMMARY OF THE INVENTION

Josephson junctions of the present invention have the unique property that the insulating barrier between the junctions's superconducting components is a non oxide insulator, especially diamond-like carbon.

Josephson junctions of the present invention are generally manufactured by first forming a superconductor layer, of selected composition, upon a suitable substrate. The said layer is deposited by any of the methods known to the prior art. At least in the area of the desired junction, a non-oxide insulation for instance, diamond-like carbon or magnesium fluoride can be deposited. The area of the desired junction is now plasma etched back, usually with oxygen present, to the desired thickness, but sometimes to a thickness still exceeding the final desired thickness (particularly when diamond-like carbon is the insulation). Then deposition of the second oxide superconducting layer is achieved. When using diamond-like carbon, the change to an oxidizing atmosphere just prior to deposition of the second superconducting oxide, results in reduction of the diamond-like carbon thickness to the final desired thickness. After the second superconducting layer is deposited, additional treatments including leads connection and application of a final sealing and coating layer on the devices are carried out as in the prior art.

In some embodiments of the present invention, during the deposition of the superconducting oxide, the deposition environment (which is almost always sub-barometric, like in chemical vapor deposition, magnetron plasma deposition or even in metallo-organic vapor deposition) contains delta singlet oxygen, and active species of molecular oxygen. This results in oxygen saturation of the superconducting matrix, thus imparting immunity to excessive reduction (and thus loss of superconductivity) during the deposition of the non-oxide insulation which is usually carried out in a reducing sub-barometric environment.

In yet another embodiment of the present invention, particularly, when the insulating layer is a diamond-like carbon layer, activation of the surface prior to diamond-like carbon deposition, with electron beam bombardment, strongly enhances the nucleation of the diamond-like carbon deposit, and thus the integrity of the deposited diamond-like carbon layer.

This invention is applicable to Josephson junctions prepared from high temperature superconducting oxides.

This invention resolves the problems encountered by other workers in the field, whereby attempts to create Josephson junctions using high temperature oxide superconductors, were unsuccessful due to the use of traditional oxide insulating barriers. The high temperatures used in such deposition processes and the proclivity of the barrier oxide and superconducting oxides to interdiffuse, have resulted in the conversion of part of the superconducting layers adjacent to the insulating oxide barrier to semiconducting (and sometimes semimetallic) or insulating materials thus increasing (uncontrollably) the thickness of the insulating barrier beyond the range necessary to create an appropriate Josephson junction (at most a few times the coherence length).

This invention solves said problems by the deposition of an impervious diamond-like carbon film, in a highly specific manner, as described in the instant invention, and resolves the aforementioned problems in a fashion that can be easily implemented using methods already employed for large scale integrated circuit technology of the prior semiconductor manufacturing art. The variety of applications for Josephson junctions are well known and include both analog and digital electronic devices, and microwave active elements as well as a variety of SQUID devices.

Certain methods will produce a Josephson junction from selected high temperature superconductor compounds so as to circumvent problems associated with oxide barriers used in the prior art.

A solution to these problems lies in the formation of the junction in which the junction has as its insulating barrier a thin layer of an insulating non-oxide substance that is a strong diffusion barrier to cationic species, for instance a barrier of diamond-like carbon about 20 to 100 angstroms thick.

Such a diamond-like carbon layer has excellent insulating properties; it does not interact excessively with the superconducting oxide to about 550° to 600° C. or better; and it is an excellent diffusion barrier to cationic species.

However, such thin layers of diamond-like carbon are difficult to deposit with current technology. When the formation of such thin layers under 200 angstroms in thickness is attempted, a surface topology involving interconnected and unconnected islands develops.

The process of the instant invention includes the deposition of a well nucleated layer to a thickness large enough to heal said topological defects and then to etch this relatively thick layer through an appropriate mask to required thickness of 20 to 100 angstroms using, for instance, an oxygen plasma.

A short exposure to an electron beam, of the area on which the diamond-like carbon is to be deposited, strongly enhances the nucleation on that surface of diamond-like carbon. Another process found to enhance nucleation of diamond-like carbon is the exposure of said superconductor oxide surface prior to depositions to a plasma in an oxygen or a delta singlet oxygen environment. The latter species of molecular oxygen, is a metastable excited state with a half life of about 40 minutes.

"Delta singlet oxygen", when used during the deposition step of the superconductor oxide, as part of the ambient (or as all the ambient) environment in which such deposition takes place, strongly enhances the concentration of trivalent copper in the substances. The purpose of the delta singlet oxygen in the present invention is to artificially raise the oxygen chemical potential of an oxygen-bearing atmosphere above that of the barometric oxygen potential in said atmosphere.

The manufacturing process of the invention includes the following steps. First, one deposits the bottom superconductor layer on a suitable substrate by any one of the now standard methods. During this step, delta singlet oxygen can be used as part of the ambient atmosphere, which will usually be sub-barometric (depending on the process, with a pressure of a few millitorrs to few tens of torrs). This use is not mandatory.

The second step can be optional, but is required with any of the superconductor materials that have a tendency to lose oxygen. Specifically, the $YBa_2Cu_3O_{(7-y)}$ composition is more likely to lose oxygen during processing than the bismuth-based superconducting oxides. This second step involves ion implantation with delta singlet oxygen O2* in a classical plasma implantation system. Because of its high excitation energy, this species acts to provide a high oxygen pressure metastable environment which is conducive to formation of the desired oxygen state in the superconducting layers of my invention.

I believe that the end result of the unique treatment of the superconducting oxide surface with delta singlet oxygen, is an increase in the oxygen content on the superconductor surface, so that when the diamond-like carbon film is plasma deposited in the following step, the reduction environment associated with such deposition, at least during the initial formation of the diamond-like carbon layer, is partially counteracted.

It should be clear that the deposition of the diamond-like carbon film should be carried out under partial vacuum, in an atmosphere which has a very low oxygen partial pressure. Even at a temperature as low as 400° C., which is the maximum expected temperature of the superconductor surface during deposition of the diamond-like carbon film, some reduction of the superconductor surface does occur. The pretreatment with delta singlet oxygen is often sufficient to stabilize the superconductive phase.

The third step involves the plasma deposition of a diamond-like carbon film on the superconducting surface. This step consists of two consecutive parts. The first involves an electron bombardment of the superconducting surface for a very short time. The second is the actual plasma deposition of the diamond-like carbon film after the first.

The purpose of the electron bombardment of the surface is to provide a high density of nucleation sites for the diamond-like carbon film on the surface of the superconductor surface. The growth of the diamond-like carbon film is initiated at said nucleation sites on the superconductor surface and it is essential in the practice of my invention to optimize the number of these sites.

Electron bombardment is rarely required if plasma treatment in the presence of delta singlet oxygen of the superconductor surface prior to diamond-like carbon deposition was performed. I believe that the said treatment has similar results in activating the superconductor surface and thus providing ample nucleation sites for the subsequent diamond-like carbon.

The diamond-like carbon is deposited from acetylene (methane and other hydrocarbons are also good precursor gases) by well known plasma deposition techniques. The substrate (superconducting layer) is maintained between 300° and 400° C. The deposition rate and duration are such that a film thickness of about 500 angstroms results. With thicknesses smaller than about 200 angstroms, the deposited diamond-like carbon may still be in the form of unconnected or partially connected islands. An important requirement of my invention is that the total active surface of the device must be covered with the said diamond-like film layer.

The fourth step requires the removal of most of the diamond-like carbon film, already deposited, by an etching process. An etching rate of no more than 200 angstrom/minute is essential, so as to be able to control the process to the required degree of the instant invention. This etching process is achieved by using the dry plasma etching mode wherein oxygen is employed. However, one can obtain flatter etched surface geometries by using the delta singlet oxygen method. The high excitation potential of the said method overwhelms the topological free energy differences in the diamond-like carbon film surface which could otherwise cause preferential etching.

The last step of my invention is the deposition of the top layer of the superconductor. One can deposit a final protective, insulating and sealing barrier as well. The last step may include application of appropriate polymer seals.

In an alternative method within the practice of my new and improved invention, the following modification can be employed. In the first step of deposition of the superconducting oxide, the deposition of the superconducting oxide layer on a suitable substrate can be effected in the presence of delta singlet oxygen. The concentration of delta singlet oxygen is dependent on the specific deposition process used and must be at least 20% of the natural oxygen present in the contained atmosphere. The effect of such delta singlet oxygen concentration is to effectively raise the chemical potential of oxygen above that normally obtained by a value equivalent to one electron volt (partitioned), i.e. the excitation level of delta singlet oxygen species above that of the ground state of molecular oxygen.

The unique element of my new and improved invention is the use of a diamond-like carbon film as an insulating barrier in the Josephson junction. I have solved the expected problems associated with the direct deposition of an extremely thin diamond-like carbon layer of the required thickness by the use of an appropriate etch-back technique.

Two other unique elements of my invention are the use of delta singlet oxygen species (both in pre diamond-like carbon film deposition and in the plasma etching process), and the electron beam bombardment of the superconducting surface to assure the high degree of homogeneity in nucleation of the said surface, prior to deposition of the diamond-like carbon film.

BRIEF DESCRIPTION OF THE DRAWING

The above and other objects, features and advantages of the present invention will become more readily apparent from the following description, reference being made to the accompanying drawing in which.

SPECIFIC DESCRIPTION AND EXAMPLES

Figure 1A:
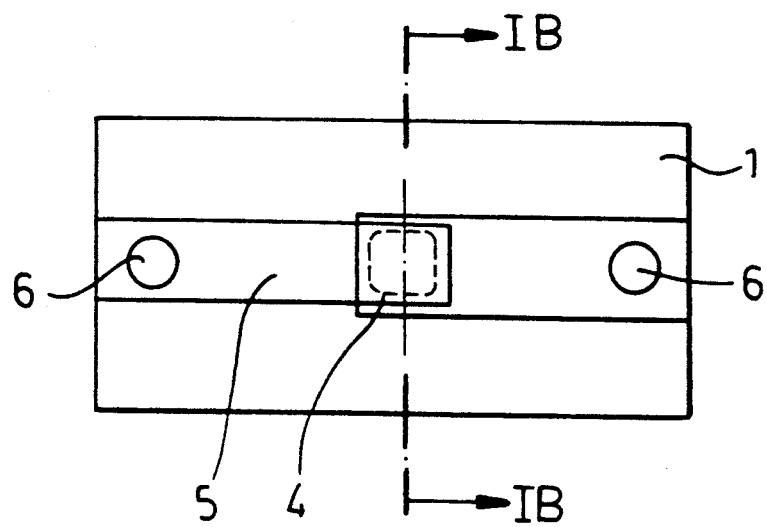
FIG. 1A is a plan view of an electronic device provided with a Josephson junction in accordance with the present invention and illustrated in highly diagrammatic form.
Figure 1B:
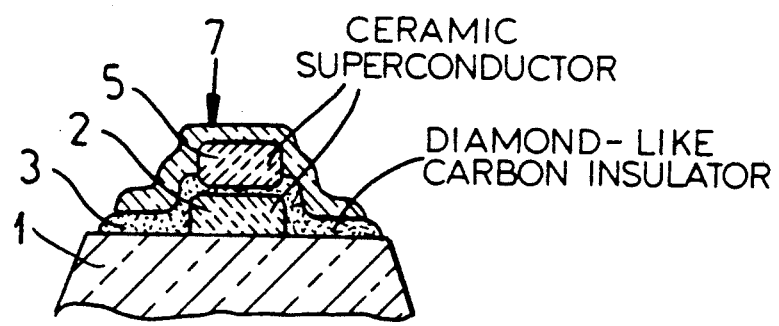
FIG. 1B is a cross sectional view taken along the line 1B—1B of FIG. 1A.

In FIG. 1A is a top view of a Josephson junction of the instant invention. In FIG. 1B a perpendicular cross section along the line 1B—1B of FIG. 1A is shown is depicted in FIGS. 2A-2D show a step by step illustration of the process as consecutive cross sections along line Y in FIG. 1A. The specific steps required to form the product of my invention are as follows: On the substrate 1 the first superconductor 2 is deposited by techniques well known in the prior art. This substrate is usually an insulator or a semiconductor, and can include strontium titanate, magnesium oxide, and silicon in single crystal forms. One can also deposit the superconductor on an amorphous well polished substrate like quartz. A preferred embodiment involves the use of delta singlet oxygen species in the ambient deposition (or carrier gas) environment during the deposition of this superconducting layer as described above. For the next step, the upper surface of this element is now bombarded for a short period with an electron beam to create a large concentration of nucleation sites for the diamond-like carbon film 3 to be deposited next. This bombardment step can be omitted in most cases if the surface of the superconductor was ion implanted with the delta-singlet oxygen species (this is easily achieved in plasma deposition of the superconducting layer by termination of the process in the presence of delta singlet oxygen while the cationic sources have been shut off). It should be clear that both techniques will increase the concentration of nucleation sites necessary for deposition of the diamond-like carbon film, in order to assure complete homogeneity of the film after said deposition.

The diamond-like carbon film is next deposited next, using an appropriate screen to allow contact on the first superconductor. The atmosphere used in this process is so chosen that the hydrogen content in the finished diamond-like carbon is minimized. When this is done, a film of diamond-like carbon results, with an effective band gap in excess of 2 electron volts. The thickness of this film is at least 500 angstroms; but can be as high as 1000 or more angstroms; In the area of the desired junction, the thickness of the diamond-like carbon layer is reduced to between 20 to 100 angstroms.

In order to do this, one must deposit a screen shaped in the desired cross section of the junction (square, circle or any other appropriate planar geometry). Through this screen, the diamond-like carbon film, already deposited, is plasma etched (using oxygen or the delta singlet oxygen process already described) as depicted by the depression 4 in FIG. 3C. The etching process is stopped when the thickness of this depression has reached between 20 to 100 angstroms. Methods of monitoring the thickness are well known in the prior art and can include monitoring the resistance in a circuit including the plasma beam, the diamond-like carbon and the superconducting layer. Since the diamond-like carbon is the high resistance element the resistance is linear with the thickness of this layer.

Figure 2A:
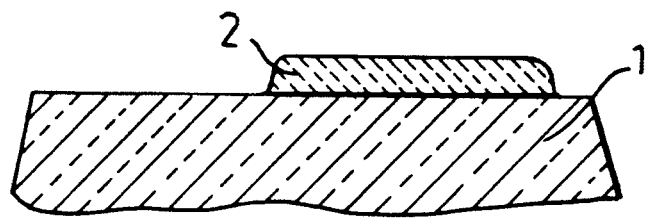
FIG. 2A–FIG. 2D are cross sectional views illustrating successive steps in the formation of an electronic device provided with a Josephson junction in accordance with the invention.
Figure 2B:
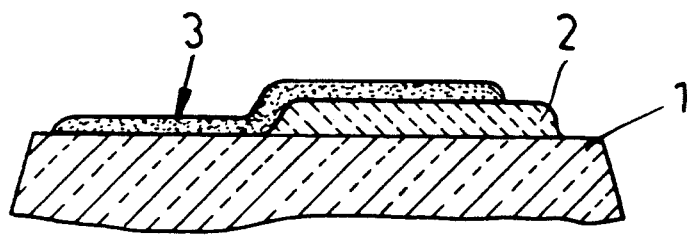
Figure 2C:
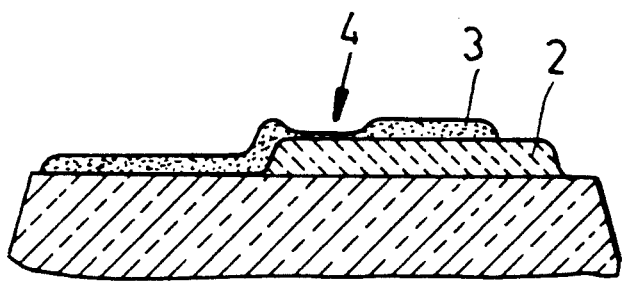
Figure 2D:
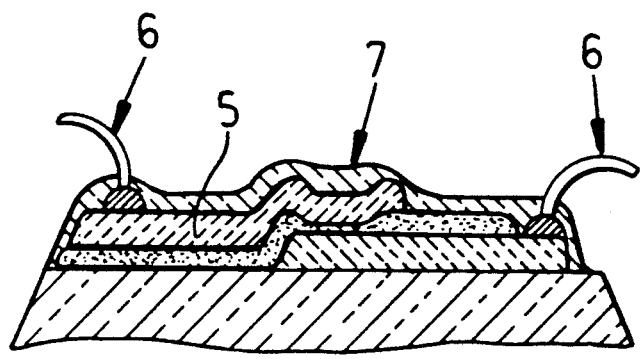

The last three finishing steps are depicted in FIG. 2D. These include: deposition of the second superconductor 5 through an appropriate screen; deposition of the leads 6; and deposition of the final sealing insulator (diamond-like carbon or an appropriate packaging polymer).

In a second approach, the steps as described are followed except that one stops the etching of the diamond-like carbon prior to reaching the desired thickness. The final reduction of this layer thickness to the desired thickness occurs during the initial stage of the deposition of the second superconducting layer. The second superconductor layer is deposited in an oxidizing environment. As the deposition step of this layer is initiated, there is a short period where only carrier gas (without the desired cations to form the superconducting layer) flow is established, and thus causes oxidation to carbon, thus thinning the film to the desired thickness.

SPECIFIC EXAMPLE

The system used in the manufacture of the Josephson junction of this invention is a simple "Bell Jar" type vacuum system, equipped with a magnetically enhanced radio frequency triode plasma sputtering system, a simple electron gun and a DC plasma generator. It should be mentioned, however, that in this specific example, the electron gun was not used and is not necessary for this specific example.

The bell jar is also equipped with a movable substrate table that can be independently heated and rotated within the bell jar so as to move it in line sequentially with the rf plasma sputtering system, the electron gun and the DC plasma system. A second rotating arm with four motorized inserts can position at will any of four independently movable quartz screens, two screens between the DC plasma and the substrate and table, the other two screens between the rf sputtering source and the table. The quartz screens are about 1.25 inch in diameter and 0.5 mm thick. The two screens that can be positioned between the table and the rf sputtering source have each a centrally located rectangular opening 20 mm long and 3 mm wide whose projection on the substrate (when inserted between the sputtering source and the substrate) are perpendicular to each other. The third screen has a single circular perforation in its center about 0.5 mm in diameter. The fourth screen is actually a ring with an inner diameter of 12 mm.

The bell jar is connected to two independently controllable gas entry leakthrough needle valves and a powerful vacuum system capable of reaching a vacuum under a millitorr within 10 seconds, when starting at about 2 to 5 torr pressure.

The first entry leakthrough valve is connected to a source of argon and delta singlet oxygen (which itself always contains some regular molecular oxygen), whose ratio of flows can be independently controlled to about 2% of total flow.

The second entry leakthrough valve is connected to a source of acetylene and ethane at a fixed ratio of 95 parts acetylene and 5 parts ethane.

The target from which the superconductor is sputtered onto the substrate is the same for both the bottom and top superconducting layers, and consists of a small disk one inch in diameter and about ⅛ of an inch thick of prepressed oxides. This target is prepared in the following manner: a mixture of 112.9 grams of $Y_2O_3$, 394.68 grams of $BaCO_3$ and 268.62 grams of CuO is mixed in a mortar with a pestel until well mixed (about five minutes). An Inconel ® die with a loose Inconel bottom of about 1.25 inch in diameter is filled with the mixture and an Inconel ® plunger is fitted inside the die to cover the powder. The covered die is then positioned in a tubular furnace preheated to 925° C. on a support and pressure of about 7500 psi is applied to the plunger. After about 15 minutes, the die is removed from the furnace and the pellet of mixed oxides forced out by pressing on one of the two pluneers. The pellet is allowed to cool to room temperature. The pellet is then cored to about 1 inch diameter with an ultrasonic coring machine, using kerosene as the abrasive carrier. Slices of about ⅛ inch thickness are cut from the pellet with a diamond saw in kerosene as a cooling medium. The pellet itself as a sputtering target, is not superconducting nor, apparently, are the powders when reacted to form a completely homogeneous mixed oxide. The pellet is however quite dense (about 5% percent porosity), and is easily handled without excessive friability.

As a substrate a well polished single crystal of strontium titanate $SrTiO_3$ is used. The orientation of the deposition surface is in the 100 plane. Silver paint is baked on the strontium titanate at two locations. Each strip is started with a small dot on the surface on which the junction is deposited, at a position where the two superconductor strip edges will be deposited and following to the side of the substrate and finishing as a contact on the reverse side of the substrate (the side facing the substrate table). The role of these silver contacts is for interfacing the junction to external voltage or current sources and to measure the thickness of the diamond-like carbon as is described below.

At the beginning of the process the substrate is positioned on the substrate table and the target is positioned in the appropriate target holder in the magnetically enhance rf triode plasma sputter device.

The bell jar is evacuated to about 0.01 millitorr or better and the substrate is brought to about 425° C. A mixture of about 10% delta singlet oxygen (about 60% pure the balance being molecular oxygen) in 90% argon is allowed to leak through and bring the pressure back to about 10 millitorr. The substrate table is already at the position under the rf sputtering source with the quartz screen having a rectangular opening above (about 1 mm apart) the strontium titanate substrate. The sputtering is initiated and continued for about 10 minutes. Once this step is completed, the rf source is turned off and simultaneously the argon source is cut off while the pump is activated for about a minute. When the pump is turned off again the pressure is allowed to reach about 2 to 5 torr of delta singlet oxygen. The temperature of the substrate is increased to about 600° C. and complete oxidation of the first superconducting layer occurs. This layer is about 1000 angstrom thick.

Without breaking the vacuum, the table is slowly turned around and positioned under the DC plasma while the pressure is reduced back to about 10 millitorr. Once the table has come to rest the DC plasma is activated at about 2 kilovolt for about 10 seconds. This apparently overload the surface with oxygen and activates the surface of the 20 mm×3 mm of the 123 superconductor layer.

The temperature of the substrate is allowed to decrease back to about 425° C. and then the pressure is once again reduced to about 0.01 millitorr. While the pump is still evacuating the system, a leak from the second leakthrough valve is allowed thus introducing into the system a mixture of acetylene and ethane (95% to 5% by volume). Simultaneously, the ring-like screen is brought above the substrate. The pump is stopped and the mixture is allowed to build to a pressure of about 1 millitorr. The DC plasma is again activated and diamond-like carbon is deposited on the whole surface including the superconducting strip, except that on both extremities of the strip about 4 mm are left without any coating. Once the diamond-like carbon layer has reached about 1000 angstroms the plasma is disconnected and the bell jar again evacuated and refilled with the original mixture of delta singlet oxygen and argon (10% delta singlet oxygen in 90% argon) to about 10 millitorr. In the meanwhile the ring quartz screen is removed and the quartz screen with the pinhole perforation (of 0.5 mm) is moved above the substrate so that the pinhole is positioned in the middle of the rectangular strip. The DC plasma is now activated at 5 KV and through the perforation the diamond-like carbon is milled out. While some of the diamond-like carbon under the screen is also lost, the rate is much slower than for the exposed layer.

The thickness of the residual barrier as it is being milled is monitored by the electrical resistance between the substrate table and the plasma cathode. This resistance is essentially the diamond-like carbon resistance and it decreases linearly with the thickness of the barrier left. This because the substrate table is in electrical contact with the silver paint, which is electrically on the bottom side of the diamond-like carbon. The resistance of the superconducting oxide (not superconducting at the deposition temperature) is miniscule relative to the resistance of the insulating diamond-like carbon.

Once the plasma milling process has reduced the thickness of the barrier to about 40 to 50 angstroms, the plasma is discontinued and the table rotated to move under the rf sputtering source, with the second rectangular quartz screen about 1 mm above the diamond-like carbon surface. The rf plasma is now activated, and during the first few seconds, we apparently lose additional diamond-like carbon (almost equally on the whole surface) due to the lack of build up on the diamond-like carbon of the "protective" superconducting oxide. Due to this effect, the plasma milling step in the prior paragraph is stopped about 10 to 20 angstrom before the ideal barrier thickness is reached. We therefore end up with a barrier about 30 to 40 angstroms thick.

The second superconducting layer is deposited in a direction which is perpendicular to the direction of the first layer and covering the small (0.5 mm) depression in the diamond-like carbon where the barrier was created, thus forming the junction. This process takes about 10 minutes as with the first layer, and the same procedure after deposition of raising the table's temperature to about 600° C. and the delta singlet oxygen pressure (without argon) to between 2 to 5 torr for complete oxidation of the superconductor second layer is completed.

The step of depositing diamond-like carbon with the ring-like screen is repeated now to cover the surface with the diamond-like carbon, except that the superconductor strip extremities are left exposed.

I now let the table cool off to room temperature and break the vacuum on the bell jar, and retrieve the junction. This specific junction consists of two strips of 123 superconductor forming a cross with diamond-like carbon deposited between them. At the central point of the cross, the insulating barrier is about 30 to 40 angstroms in the thickness.

Contact to each strip is made with a silver/tin solder on the previously painted silver strips.

The junction is now potted in epoxy and can be easily handled.

I claim:

1. A Josephson junction, comprising:
   a first layer of a $YBa_2Cu_3O_{7-y}$ superconductor;
   an insulating layer of diamond carbon resistant to cation diffusion therethrough on said first layer and incapable of interdiffusing with the superconductor, said insulating layer being of a thickness of 20 to 100 angstroms; and a second layer of a $YBa_2Cu_3O_{7-y}$ superconductor on said insulating layer and exhibiting with said first layer and said insulating layer Josephson tunneling at temperatures below a critical temperature of said superconductor.

2. The Josephson junction defined in claim 1 wherein said first layer is provided on a substrate, further comprising respective leads connected to said first and second layers of said superconductors, and a protective layer covering said second layer and enclosing said junction.

3. The Josephson junction defined in claim 2 wherein said first and second superconductive layers have portions extending beyond a junction region at which said superconductive layers have common projections with said insulating layer, said leads being provided on said portions.

4. The Josephson junction defined in claim 3 wherein said layers are parallel in said region and said superconductors are nonparallel at least at some parts of said portions.

5. The Josephson junction defined in claim 3 wherein a layer of said diamond carbon extends at a thickness of at least 500 angstroms over at least part of said portions between said first and second superconductor layers.

* * * * *